(12) United States Patent
Takeuchi et al.

(10) Patent No.: US 9,085,483 B2
(45) Date of Patent: Jul. 21, 2015

(54) SEALING MATERIAL PASTE AND PROCESS FOR PRODUCING ELECTRONIC DEVICE EMPLOYING THE SAME

(71) Applicant: ASAHI GLASS COMPANY, LIMITED, Chiyoda-ku (JP)

(72) Inventors: Toshihiro Takeuchi, Chiyoda-ku (JP); Satoshi Fujimine, Chiyoda-ku (JP); Kazuo Yamada, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 334 days.

(21) Appl. No.: 13/714,915

(22) Filed: Dec. 14, 2012

(65) Prior Publication Data

US 2013/0174608 A1 Jul. 11, 2013

Related U.S. Application Data

(63) Continuation of application No. PCT/JP2011/063534, filed on Jun. 13, 2011.

(30) Foreign Application Priority Data

Jun. 14, 2010 (JP) ................................. 2010-135296

(51) Int. Cl.
| C03C 8/24 | (2006.01) |
| C03C 3/14 | (2006.01) |
| C03C 17/04 | (2006.01) |
| H05B 33/04 | (2006.01) |
| H05B 33/10 | (2006.01) |
| H01L 51/52 | (2006.01) |

(52) U.S. Cl.
CPC ... *C03C 8/24* (2013.01); *C03C 3/14* (2013.01); *C03C 17/04* (2013.01); *H05B 33/04* (2013.01); *H05B 33/10* (2013.01); *H01L 51/5246* (2013.01)

(58) Field of Classification Search
CPC ............ C03C 8/24; C03C 3/14; H05B 33/10; H05B 33/04; H01L 51/5246
USPC ................................................. 501/14, 15, 20
See application file for complete search history.

(56) References Cited

U.S. PATENT DOCUMENTS 6,255,239 B1 * 7/2001 Sakoske .......................... 501/77
7,291,573 B2 * 11/2007 Ide .................................. 501/50

(Continued)

FOREIGN PATENT DOCUMENTS

| JP | 6-72740 | 3/1994 |
| JP | 11-209147 | 8/1999 |
| JP | 2001-19473 | 1/2001 |
| JP | 2004-277259 | 10/2004 |
| JP | 2008-59802 | 3/2008 |
| JP | 2008-115057 | 5/2008 |
| JP | 2009-227566 | 10/2009 |
| JP | 2010-47441 | 3/2010 |
| JP | 2010-111520 | 5/2010 |
| WO | WO 2010/061853 A1 | 6/2010 |

OTHER PUBLICATIONS

International Search Report issued Sep. 6, 2011 in PCT/JP2011/063534 filed Jun. 13, 2011.

*Primary Examiner* — Karl Group
(74) *Attorney, Agent, or Firm* — Oblon, McClelland, Maier & Neustadt, L.L.P.

(57) ABSTRACT

A sealing material paste and a process for producing an electronic device are provided, which realize suppressing with good reproducibility generation of bubbles in a sealing layer when a rapid heating-rapid cooling process with a temperature-rising speed of at least 100° C./min is applied to seal two glass substrates together. The sealing material paste, wherein the amount of water is at most 2 volume %, is applied on a sealing region of a glass substrate 2, and such a coating film 8 is fired to form a sealing material layer 7. The glass substrate 2 is laminated with another glass substrate via a sealing material layer 7, and they are heated with a temperature-rising speed of at least 100° C./min to be sealed together.

14 Claims, 2 Drawing Sheets

(56) References Cited

U.S. PATENT DOCUMENTS 7,931,948 B2 * 4/2011 Nishinaka et al. .............. 428/34
8,697,242 B2 * 4/2014 Kawanami et al. ........... 428/426
2009/0009429 A1 * 1/2009 Nishinaka et al. .............. 345/60
2009/0272294 A1 * 11/2009 Yamada et al. ............ 106/286.3
2011/0223371 A1 * 9/2011 Kawanami ...................... 428/76

* cited by examiner

SEALING MATERIAL PASTE AND PROCESS FOR PRODUCING ELECTRONIC DEVICE EMPLOYING THE SAME

This application is a continuation of PCT Application No. PCT/JP2011/063534, filed on Jun. 13, 2011, which is based upon and claims the benefit of priority from Japanese Patent Application No. 2010-135296 filed on Jun. 14, 2010. The contents of those applications are incorporated herein by reference in its entirety.

TECHNICAL FIELD

The present invention relates to a sealing material paste to be suitably employed for sealing by means of rapid heating-rapid cooling process, and a process for producing an electronic device employing such a paste.

BACKGROUND ART

A flat panel display device (FPD) such as an organic EL display (organic electro-luminescence display: OELD), a plasma display panel (PDP) or a liquid crystal display device (LCD) has such a structure that a glass substrate for element, that has a display element formed thereon, and a glass substrate for sealing are disposed to face each other and the display element is sealed in a glass package comprising two such glass substrates bonded. Further, for a solar cell such as a dye-sensitized solar cell, application of a glass package having a solar cell element (dye-sensitized photoelectric conversion element) sealed with two glass substrates has been studied.

As a sealing material to seal two glass substrates together, application of a sealing glass excellent in moisture resistance, etc. is in progress. Since the sealing temperature of the sealing glass is at a level of from 400 to 600° C., properties of an electronic element portion of an organic EL (OEL) element or the like tend to be deteriorated by a heating treatment using a firing furnace. To solve this problem, application of local heating by a laser beam for forming a sealing layer is in progress (refer to Patent Documents 1 and 2). The sealing by a laser beam is carried out, for example, in the following process. First, a sealing material containing a sealing glass and a laser absorbent, etc. is blended with a vehicle to prepare a sealing material paste, the paste was applied on a sealing region of one of glass substrates, and such a coating layer of the sealing material paste is fired to form a sealing material layer. Subsequently, the glass substrate having the sealing material layer is laminated with another glass substrate, and the sealing material layer is irradiated with a laser beam to heat the layer to form a sealing layer.

Use of the sealing by laser irradiation can suppress thermal influence on an electronic element portion, but it has a problem that since it is a process of rapidly heating and rapidly cooling the sealing material layer, bubbles tend to be produced in the sealing material layer. Namely, when the sealing material layer is melted by applying laser heating, temperature-rising and temperature-falling speeds of the sealing material layer are faster than those of heating in a normal firing furnace, and accordingly, bubbles tend to be produced in the sealing layer. Such a bubble in the sealing layer functions as a starting point of peeling or breakage, and causes defective sealing. Bubbles caused by a rapid heating-rapid cooling process of the sealing material layer tend to be produced not only in the case of laser heating but also in a case of a heating step of infrared heating, dielectric heating, induction heating or resistance heating, etc. whereby the temperature-rising speed becomes at least 100° C./min like the laser heating. In particular, since the laser heating causes an extremely high temperature-rising speed, bubbles tend to be produced by the laser heating.

Patent Document 3 describes that in order to suppress generation of bubbles at a time of vacuum sealing, the water content in a sealing glass is limited to be at most 300 ppm. However, there is no consideration as to a sealing step using a rapid heating-rapid cooling process such as laser heating or infrared heating. Further, Patent Document 4 describes that the amount of water in a dielectric paste for plasma display panel is limited to be at most 3 mass % in order to achieve smoothness and uniformity of the coating layer and to improve surface state of a fired layer (dielectric layer). This dielectric layer is fired in a normal firing furnace, and there is no consideration as to a heating step using a rapid heating-rapid cooling process such as laser heating or infrared heating.

Patent Document 5 describes that in a bismuth glass powder produced by water pulverization, water is adsorbed to the glass powder and the adsorbed water is not completely evaporated by laser irradiation and remains to cause bubbles, and that to solve this problem, the bismuth glass powder is produced by solvent pulverization to reduce adsorbed water to thereby suppress generation of bubbles. Namely, the document discloses a technique of reducing adsorbed water by reducing contact of a bismuth glass powder with water.

PRIOR ART DOCUMENTS

Patent Documents

Patent Document 1: JP-A-2008-059802
Patent Document 2: JP-A-2008-115057
Patent Document 3: JP-A-06-072740
Patent Document 4: JP-A-11-209147
Patent Document 5: JP-A-2010-111520

DISCLOSURE OF INVENTION

Technical Problem

It is an object of the present invention to provide a sealing material paste whereby generation of bubbles in a sealing material layer caused by a rapid heating-rapid cooling process can be suppressed with good reproducibility at a time of applying a rapid heating-rapid cooling process with a temperature-rising speed of at least 100° C./min in order to seal two glass substrates together; and a process for producing an electronic device which uses such a sealing material paste and which achieves improvement of sealing property and its reliability.

Solution to Problem

The sealing material paste of the present invention is a sealing material paste to be used for a sealing utilizing rapid heating with a temperature-raising speed of at least 100° C./min, which contains a mixture of a sealing material containing a sealing glass and a low expansion filler and a vehicle produced by dissolving an organic resin in an organic solvent, wherein the amount of water in the sealing material paste is at most 2 volume %.

The process for producing an electronic device of the present invention comprises; preparing a first glass substrate having a first surface having a first sealing region, preparing a second glass substrate having a second surface having a second sealing region corresponding to the first sealing region of the first glass substrate; applying a sealing material paste on the first sealing region and/or the second sealing region and firing such an coating layer of the sealing material paste to form a sealing material layer, the sealing material paste containing a mixture of a sealing material containing a sealing glass and a low expansion filler and a vehicle prepared by dissolving an organic resin in an organic solvent, wherein the amount of water in the sealing material paste is at most 2 volume %; laminating the first glass substrate and the second glass substrate via the sealing material layer so that the first surface faces to the second surface; and heating the laminate of the first glass substrate and the second glass substrate with a temperature-rising speed of at least 100° C./min to melt the sealing material layer to seal an electronic element portion provided between the first glass substrate and the second glass substrate.

Advantageous Effects of Invention

In the sealing material paste and the process for producing an electronic device of the present invention, it is possible to suppress with good reproducibility generation of bubbles in a sealing layer caused by rapid heating with a temperature-rising speed of at least 100° C./min. Accordingly, it becomes possible to improve sealing property of an electronic device and its reliability.

BRIEF DESCRIPTION OF DRAWINGS

FIG. 1A is a cross-sectional view showing a first glass substrate and a second glass substrate having a sealing material layer.

FIG. 1B is a cross-sectional view showing a first glass substrate and a second glass substrate to be laminated via a sealing material layer.

FIG. 1C is a cross-sectional view showing a sealing material layer to be irradiated with a laser beam through a second glass substrate.

FIG. 1D is a cross-sectional view showing a sealing layer sealing a space between a first glass substrate and a second glass substrate.

FIG. 6A is a cross-sectional view showing a sealing region of a second glass substrate to form a coating layer of the sealing material paste.

FIG. 6B is a cross-sectional view showing a sealing material layer constituted by a fired layer of the sealing material.

DESCRIPTION OF EMBODIMENTS

Now, embodiments of the present invention will be described with reference to drawings. FIGS. 1 to 5 are views illustrating a process for producing an electronic device of an embodiment of the present invention. Here, as the electronic device to which the process of the embodiment of the present invention is applied, a FPD such as OELD, PDP or LCD, an illumination device employing a light-emitting element such as an OEL element, or a sealing type solar cell such as a dye-sensitized solar cell, may be mentioned.

Figure 1A:
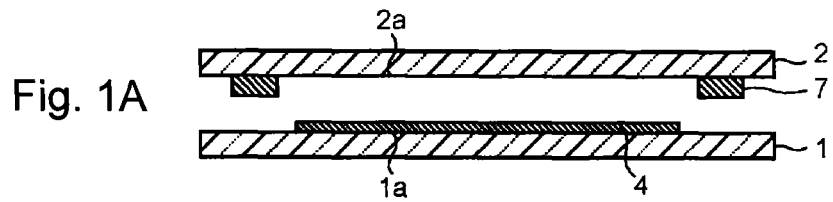
FIGS. 1A-D are cross-sectional views showing a process for producing an electronic device of an embodiment of the present invention.

First, as shown in FIG. 1A, a first glass substrate 1 and a second glass substrate 2 are prepared. As the first and the second glass substrates 1 and 2, for example, glass substrates made of e.g. alkali-free glass or soda lime glass having a known composition are employed. Such an alkali-free glass has a thermal expansion coefficient of about from 35 to $40 \times 10^{-7}$/° C. Such a soda lime glass has a thermal expansion coefficient of about from 80 to $90 \times 10^{-7}$/° C.

Figure 2:
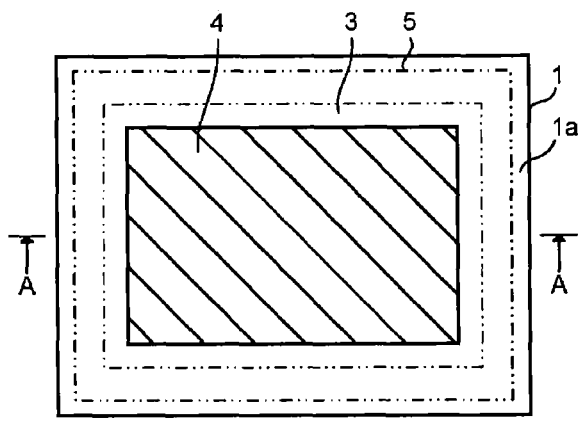
FIG. 2 is a plan view showing a first glass substrate to be employed in the process for producing an electronic device shown in FIGS. 1A-D.
Figure 3:
FIG. 3 is a cross-sectional view along a A-A line in FIG. 2.

The first glass substrate 1 has a surface 1a having an element region 3 as shown in FIGS. 2 and 3. In the element region 3, an electronic element portion 4 depending on an objective electronic device is provided. The electronic element portion 4 is, for example, provided with an OEL element in a case of OELD or OEL illumination, a plasma emission element in a case of PDP, a liquid crystal display element in a case of LCD, and a dye-sensitized solar cell element (dye-sensitized photoelectric conversion element) in a case of solar cell. The electronic element portion 4 provided with a light-emitting element such as an OEL element, or a dye-sensitized solar cell element, has a known structure. This embodiment is not limited to the element structure of the electronic element portion 4.

Figure 4:
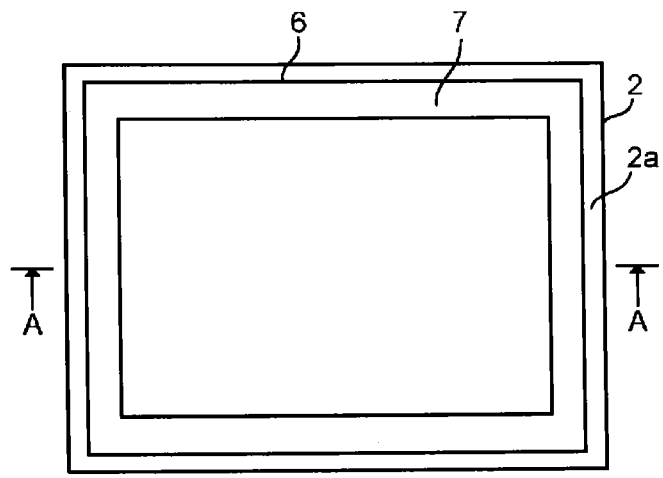
FIG. 4 is a plan view showing a second glass substrate to be employed in the process for producing an electronic device shown in FIGS. 1A-D.
Figure 5:
FIG. 5 is a cross-sectional view along a A-A line in FIG. 4.

On the surface 1a of the first glass substrate 1, a first sealing region 5 is provided along the outer periphery of the element region 3. The first sealing region 5 is provided so as to encompass the element region 3. The second glass substrate 2 has a surface 2a facing to the surface 1a of the first glass substrate 1. On the surface 2a of the second glass substrate 2, as shown in FIGS. 4 and 5, a second sealing region 6 corresponding to the first sealing region is provided. The first and the second sealing regions 5 and 6 constitute a sealing layer-formed region. (For example, in a case of forming the sealing material layer in the second sealing region 6, the sealing material layer-formed region constitutes a sealing region.)

The electronic element portion 4 is provided between the surface 1a of the first glass substrate 1 and the surface 2a of the second glass substrate 2. In the process for producing an electronic device shown in FIGS. 1A-D, the first glass substrate 1 constitutes a glass substrate for element, and on its surface 1a, an element structure such as an OEL element or a PDP element is formed as the electronic element portion 4. The second glass substrate 2 constitutes a glass substrate for sealing the electronic element portion 4 formed on the surface 1a of the first glass substrate 1.

However, the construction of the electronic element portion 4 is not limited thereto. For example, when the electronic element portion 4 is e.g. a dye-sensitized solar cell element, an element film such as a wiring film or an electrode film forming an element structure, is formed on the surfaces 1a and 2a of the first and the second glass substrates 1 and 2. The element film constituting the electronic element portion 4 and the element structure based on the element film, is formed at least one of the surfaces 1a and 2a of the first and the second glass substrates 1 and 2.

On the sealing region 6 of the second glass substrate 2, as shown in FIG. 1A, FIG. 4 and FIG. 5, a frame-shaped sealing material layer 7 is formed. The sealing material layer 7 is a fired layer of a sealing material. The sealing material is a material produced by adding a low expansion filler to a sealing glass being the main component, and as the case requires, adding an inorganic filler depending on a heating method of the sealing material layer 7. For example, in a case of applying laser heating or infrared heating to heat the sealing material 7, an electromagnetic wave absorbent such as a laser absorbent or an infrared absorbent is added to the sealing material. In a case of applying dielectric heating, a dielectric material is added and in a case of applying induction heating or resistance heating, an inorganic filler such as a conductive material is added. The sealing material may contain a filler or an additive other than these additives as the case requires.

As the sealing glass (i.e. glass frit), for example, a low-melting point glass such as a bismuth glass, a thin-phosphate glass, a vanadium glass or a lead glass is employed. Among them, considering e.g. the sealing property with the glass substrates 1 and 2 (i.e. bonding property) or its reliability (for example, bonding reliability or closeness) or an impact on environment or human body, it is preferred to use a low-melting point sealing glass composed of a bismuth glass or a tin-phosphate glass. The process of this embodiment is suitable particularly in a case of using a bismuth glass as the sealing glass (glass frit).

The bismuth glass (glass frit) preferably has a composition containing, as calculated as mass percentage of the following oxides, from 70 to 90 mass %, preferably from 72 to 88 mass % of $Bi_2O_3$, from 1 to 20 mass %, preferably from 3 to 18 mass % of ZnO and from 2 to 18 mass %, preferably from 2 to 15 mass % of $B_2O_3$. $Bi_2O_3$ is a component to form the network structure of glass. If the content of $Bi_2O_3$ is less than 70 mass %, the softening point of the glass frit becomes high and it becomes difficult to seal at a low temperature. If the content of $Bi_2O_3$ exceeds 90 mass %, vitrification tends to be difficult, and the thermal expansion coefficient tends to be too high.

ZnO is a component to reduce e.g. thermal expansion coefficient. If the content of ZnO is less than 1 mass %, vitrification becomes difficult. If the content of ZnO exceeds 20 mass %, stability at a time of forming a glass tends to decrease to cause devitrification, whereby a glass may not be obtained.

$B_2O_3$ is a component to expand a range wherein formation of the bone structure of glass and vitrification are possible. If the content of $B_2O_3$ is less than 2 mass %, vitrification becomes difficult. If the content of $B_2O_3$ exceeds 18 mass %, the softening point becomes so high that sealing at a low temperature becomes difficult even if a load is applied at the time of sealing.

A glass formed by three components (basic components) i.e. $Bi_2O_3$, ZnO and $B_2O_3$, has a low transition point and is suitable as a sealing material for low temperature sealing. However, the glass may contain an optional component such as $Al_2O_3$, $CeO_2$, CuO, $Fe_2O_3$, $Ag_2O$, $WO_3$, $MoO_3$, $Nb_2O_3$, $Ta_2O_5$, $Ga_2O_3$, $Sb_2O_3$, $Li_2O$, $Na_2O$, $K_2O$, $Cs_2O$, CaO, SrO, BaO, $WO_3$, $SiO_2$, $P_2O_5$ or SnO), (x is 1 or 2). However, if the content of the optional component is too large, the glass may become unstable to cause devitrification, or the glass transition point or the softening point may become high. Accordingly, the total content of the optional components is preferably at most 30 mass %, more preferably at most 20 mass %. In this case, the glass composition is adjusted so that the total amount of the basic components and the optional components becomes basically 100 mass %.

The content of the optional component is as calculated as mass percentage of the following oxides.

Among the above optional components, $Al_2O_3$ is a component to decrease thermal expansion coefficient and to improve stability of a low melting point glass at a time of firing. The content of $Al_2O_3$ is preferably within a range of from 0 to 5 mass %, more preferably within a range of from 0.1 to 5 mass %. If the content of $Al_2O_3$ exceeds 5 mass %, the viscosity of the glass becomes high and $Al_2O_3$ tends to remain in the low-melting point glass as unmelted product. When the glass contains at least 0.1 mass % of $Al_2O_3$, stability of the low-melting point glass at the time of firing can be more effectively improved.

$Fe_2O_3$ is a component which hardly increases the viscosity but suppresses crystallization of glass at a time of sealing to thereby extend a temperature range in which sealing is possible. However, if $Fe_2O_3$ is added excessively, vitrification range becomes small, and accordingly, the content is preferably within a range of from 0 to 0.5 mass %, more preferably within a range of from 0.01 to 0.2 mass %. CuO is a component to lower the viscosity of glass, and to expand a temperature range in which sealing is possible particularly to the low temperature side, and its content is preferably within a range of from 0 to 5 mass %, more preferably within a range of from 0.1 to 3 mass %. If the content of CuO exceeds 5 mass %, precipitation speed of crystals becomes large and the temperature range in which sealing is possible becomes narrow in the high temperature side.

$CeO_2$ is a component to suppress precipitation of $Bi_2O_3$ in the glass composition and resulting formation of metal bismuth at a time of melting glass, and to stabilize fluidity of the glass. The content of $CeO_2$ is preferably within a range of from 0 to 5 mass %, more preferably within a range of from 0.1 to 5 mass %. If the content of $CeO_2$ exceeds 5 mass %, the viscosity of glass becomes high, and sealing at a low temperature becomes difficult. Further, $CeO_2$ has an effect of suppressing deterioration (corrosion or cracking) of a crucible made of Pt or a Pt alloy at a time of melting a bismuth glass in the crucible.

The sealing material contains a low expansion filler. As the low expansion filler, for example, at least one member selected from the group consisting of silica, alumina, zirconia, zirconium silicate, aluminum titanate, mullite, cordierite, eucryptite, spodumene, a zirconium phosphate compound, a tin oxide compound, a quartz solid solution and mica is employed. As the zirconium phosphate compound, $(ZrO)_2P_2O_7$, $NaZr_2(PO_4)_3$, $KZr_2(PO_4)_3$, $Ca_{0.5}Zr_2(PO_4)_3$, $NbZr(PO_4)_3$, $Zr_2(WO_3)(PO_4)_2$ or their composite compound, etc. may be mentioned. The low expansion filler has a thermal expansion coefficient lower than that of the sealing glass.

The content of the low expansion filler is appropriately set so that the thermal expansion coefficient of the sealing glass becomes close to the thermal expansion coefficients of the glass substrates 1 and 2. The content of the low expansion filler in the sealing material depends on the thermal expansion coefficients of the sealing glass and the glass substrates 1 and 2, and is preferably within a range of from 0.1 to 40 mass %, more preferably within a range of from 1 to 35 mass %. If the content of the low expansion filler is less than 0.1 mass %, the effect of adjusting the thermal expansion coefficient of the sealing material may not be sufficiently obtained. On the other hand, if the content of the low expansion filler exceeds 40 mass %, the fluidity of the sealing material may be deteriorated to lower the bonding strength.

As described above, the sealing material contains an inorganic filler depending on the heating method as the case requires. In a case of applying heating by electromagnetic waves such as laser heating or infrared heating to heat the sealing material layer 7, the sealing material preferably contains an electromagnetic wave absorbent (for example, a material absorbing electromagnetic waves such as a laser beam or infrared rays to generate heat) such as a laser absorbent or an infrared absorbent. Also in a case of applying a heating method other than laser heating or infrared heating, the sealing material preferably contains an inorganic filler depending on the heating method. However, in a case where the sealing glass itself absorbs electromagnetic waves such as a laser beam or infrared rays, it is not necessary that the sealing material contains an inorganic filler. This applies to cases of using other heating methods.

As the electromagnetic wave absorbent, at least one metal selected from the group consisting of Fe, Cr, Mn, Co, Ni and Cu, or a compound such as an oxide containing the above metal is employed. It may be a pigment other than them. The content of the electromagnetic wave absorbent is preferably within a range of from 0 to 20 mass %, more preferably within a range of from 0 to 15 mass % based on 100 mass % of the sealing material. If the content of the electromagnetic wave absorbent exceeds 20 mass %, local heating in the vicinity of the interface with the second glass substrate 2 may occur or the fluidity of the sealing material at the time of melting may be deteriorated to lower the bonding property. When the sealing glass itself does not have an ability of absorbing e.g. a laser beam or infrared rays, the sealing material preferably contains at least 0.1 mass % of an electromagnetic wave absorbent. If the content of the electromagnetic wave absorbent is less than 0.1 mass %, it may not be possible to sufficiently melt the sealing material layer 7.

The sealing material layer 7 is formed in the following process. The process for forming the sealing material layer 7 will be described with reference to FIGS. 6A-B. First, e.g. a low expansion filler is blended into a sealing glass to prepare a sealing material, and the sealing material is blended with a vehicle to prepare a sealing material paste. The vehicle is prepared by dissolving an organic resin in an organic solvent. The vehicle may contain an additive other than them. The content of the organic resin in the sealing material paste is preferably within a range of from 0.1 to 5 mass %, more preferably within a range of from 0.1 to 4 mass %. If the content of the organic resin is less than 0.1 mass %, it may become difficult to maintain the shape of a coating layer of the sealing material paste, and if it exceeds 5 mass %, it is not possible to sufficiently remove the organic resin in a subsequent firing step and a residue carbon may increase.

As an organic resin component (that is a binder component) of the vehicle, methylcellulose, ethylcellulose, carboxymethylcellulose, oxyethylcellulose, benzylcellulose, propylcellulose, nitrocellulose, methyl(meth)acrylate, ethyl (meth)acrylate, butyl(meth)acrylate, 2-hydroxyethyl methacrylate may, for example, be mentioned. As the organic solvent for dissolving the organic resin component, terpineol, diethylenegylcol monoethylether acetate, diethylenegylcol monobutylether acetate, propyleneglycol diacetate, 2,2,4-trimethyl-1,3-pentadiol monoisobutyrate, 2,2,4-trimethyl-1,3-pentanediol diisobutyrate, diethylenegylcol mono-2-ethylhexylether or 1,3-butyleneglycol diacetate may, for example, be employed. At least two types of organic solvents may be mixed for use.

The above-described vehicle and the sealing material are blended to prepare a sealing material paste. The viscosity of the sealing material paste may be adjusted to a viscosity suitable to an apparatus for coating the glass substrate 2, and the viscosity can be adjusted by changing the ratio between the organic resin and the organic solvent or the ratio between the sealing material and the vehicle. The sealing material paste may contain an organic solvent for dilution or a known additive for glass paste such as an antifoaming agent or a dispersing agent. To prepare the sealing material paste, a known method employing e.g. a rotation type mixer provided with a stirring blade, a roll mill, a ball mill etc. may be employed.

Figure 6A:
FIGS. 6A-B are cross-sectional views showing a step of forming a sealing material layer on the second glass substrate in the process for producing an electronic device shown in FIGS. 1A-D.

The above sealing material paste is applied on a sealing region 6 of the second glass substrate 2 as shown in FIG. 6A to form a coating layer 8 of the sealing material paste. The sealing material paste may be applied on the sealing region 5 of the first glass substrate 1. As an alternative, the sealing material paste may be applied both on the sealing region 6 of the second glass substrate 2 and the sealing region 5 of the first glass substrate 1. The sealing material paste is applied on the sealing region 6 by using a printing method such as screen printing or gravure printing, or applied along the sealing region 6 by using e.g. a dispenser. Here, at the time of forming a coating layer 8 of the sealing material paste, a sealing material paste wherein the amount of water is reduced is employed.

As described later, the coating layer 8 of the sealing material paste is fired, and subjected to a heating step with a temperature-rising speed of at least 100° C./min to be melted. At the time of firing the coating layer 8 to form a sealing material layer 7, a common firing furnace is employed, and accordingly, influence of the amount of water in the sealing material paste is not significant and no generation of bubbles is observed. However, at a time of rapid heating of the sealing material layer 7 with a temperature-rising speed of at least 100° C./min to form a sealing layer 9, the amount of water in the sealing material paste causes an adverse effect. Namely, it is considered that since the temperature-rising and temperature-falling speeds of the sealing material layer 7 become high, water remained in the sealing material layer 7 is rapidly heated at the time of temperature-rising to generate bubbles, and they tend to be contained inside at the time of rapid cooling to generate bubbles in the sealing layer 9.

To cope with such a problem, by using a sealing material paste wherein the amount of water is reduced, even in a case of heating the sealing material layer 7 with a temperature-rising speed of at least 100° C./min to form the sealing layer 9, it is possible to suppress generation of bubbles in the sealing layer 9. Specifically, by making the amount of water in the sealing material paste to be at most 2 volume %, the amount of water remained in the sealing material layer 7 is reduced, and even if the sealing material layer 7 is heated with a temperature-rising speed of at least 100° C./min, it becomes possible to suppress generation of bubbles. The sealing material paste having a water amount of at most 2 volume % is particularly effective in a case of employing a bismuth glass as the sealing glass (glass frit).

By making the amount of water in the sealing material paste, that is prepared by mixing a sealing material containing a sealing glass comprising a bismuth glass with a vehicle, to be at most 2 volume %, it is possible to suppress with good reproducibility generation of bubbles at a time of forming a sealing layer 9 by applying a heating step with a temperature-rising speed of at least 100° C./min. The amount of water in the sealing material paste is more preferably made to be at most 1.5 volume %. It is possible to securely prevent generation of bubbles by making the amount of water in the sealing material paste to be substantially zero, but when the amount of water is made to be close to zero, behavior of the viscosity of the sealing material paste may be adversely affected. For this reason, the amount of water in the sealing material paste is preferably made to be at least 0.1 volume %.

In this patent, the amount of water in the sealing material paste was measured by a Karl Fischer moisture meter. Specifically, a moisture meter CA-100 and a moisture evaporation apparatus VA-100 manufactured by Mitsubishi Chemical Analytech Co., Ltd. were employed as the apparatuses. A coulometric titration method was used for the measurement, and AQUAMICRON AX was used as an anode liquid and AQUAMICRON CXU was used as a cathode liquid. The measurement was carried out while the sealing material paste was heated to 300° C. ("AQUAMICRON" is a trademark of Mitsubishi Chemical Corporation).

Here, explanation has been made mainly with respect to a case of employing a bismuth glass as the sealing glass, but the sealing glass being the main component of the sealing material is not limited to a bismuth glass. Also in a case of a sealing material employing a sealing glass other than a bismuth glass, by reducing the amount of water in the sealing material paste, it is possible to suppress generation of bubbles in the sealing layer 9.

Such a sealing material paste wherein the amount of water is reduced can be obtained, for example, by preparing the paste in a low moisture environment, by reducing the amount of water in constituents of the sealing material such as a sealing glass or a low expansion filler, by reducing the amount of water in constituents of vehicle such as an organic resin or an organic solvent, or by applying a dehydration treatment to a prepared paste. For example, the sealing material paste is preferably prepared in an environment wherein the absolute humidity is at most 8 $g/m^3$. The amount of water in constituents of the sealing material layer can be reduced, for example, by preliminarily firing at a temperature of at least 200° C. The upper limit temperature of the preliminary firing is preferably at most the transition point of the sealing glass, and preliminary firing at a temperature higher than the transition point may adversely affect the sealing property. The amount of water in the constituents of the vehicle can be reduced, for example, by a reduced-pressure treatment of –0.08 MPa or lower. Dehydration treatment to a prepared paste can be also achieved in the same manner. The dehydration treatment to the paste is a treatment of stirring the paste in a sealed container having a stirring capability for 30 minutes while the pressure in the container is reduced to, for example, –0.08 MPa or lower. By this operation, it is possible to reduce the amount of water contained in the paste. These methods can be appropriately combined and applied according to e.g. the amount of water in the material or preparation environment of the paste.

Here, the above constituents of the sealing material mean the sealing glass, the low expansion filler, and, as the case requires, an electromagnetic wave absorbent applicable to the sealing material, and the constituents of the vehicle mean the organic resin, the organic solvent and, as the case requires, an additive applicable to the vehicle.

Figure 6B:

At a time of forming a sealing material layer 7, the coating layer 8 of the sealing material paste is preferably dried at a temperature of at least 120° C. for at least 10 minutes. The drying step is to remove an organic solvent in the coating layer 8. If the organic solvent remains in the coating layer 8, an organic resin component may not be sufficiently removed in the subsequent firing step. Subsequently, the coating layer (when the coating layer is dried, a dry film) 8 of the sealing material paste is fired to form a sealing material layer 7. In the firing step, the coating layer 8 is heated to a temperature of at most the glass transition point of the sealing glass (glass frit) being the main component of the sealing material, to remove organic resin components of the coating layer 8, and thereafter, the coating layer is heated to a temperature of at least the softening point of the sealing glass (glass frit) to melt the sealing glass to fusion-bond the sealing glass to the glass substrate 2. In this procedure, as shown in FIG. 6B, a sealing material layer 7 constituted by a fired layer of the sealing material is formed.

Figure 1B:
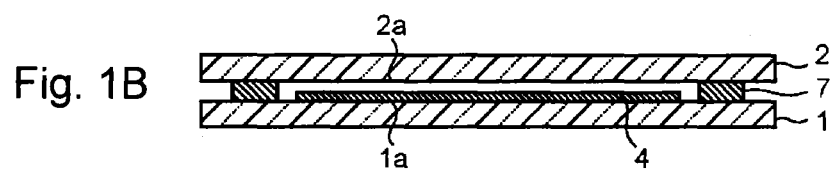

Next, the second glass substrate 2 on which the coating layer 8 of the sealing material paste is fired to form a sealing material layer 7, and a first glass substrate 1 prepared separately from the second glass substrate 2, are employed to produce an electronic device of, for example, a FPD such as OELD, PDP or LCD, an illumination device employing an OEL element or a solar cell such as a dye-sensitized solar cell. Namely, as shown in FIG. 1B, the first glass substrate 1 and the second glass substrate 2 are laminated via the sealing material layer so that the surface 1a and the surface 2a of the substrates face to each other. Between the first glass substrate 1 and the second glass substrate 2, a gap forming an electronic element portion 4—formed region is formed according to the thickness of the sealing material layer 7.

Here, in this specification, for convenience, as described above, a glass substrate on which an electronic element portion is formed is referred to as a first glass substrate, and such an embodiment is a normal embodiment, but naming of the first and the second glass substrates may be opposite.

Figure 1C:
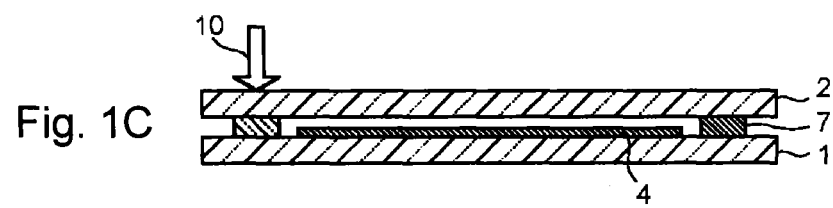

Subsequently, the laminate of the first glass substrate 1 and the second glass substrate 2 is heated by applying a heating step whereby the temperature-rising speed becomes at least 100° C./min, to melt and solidify the sealing glass in the sealing material layer 7 to form a sealing layer 9 for sealing an electronic element portion provided between the first glass substrate 1 and the second glass substrate 2. As the heating step whereby the temperature-rising speed becomes at least 100° C./min, as described above, laser heating, infrared heating, dielectric heating, induction heating, resistance heating, etc. may be mentioned. For example, in a case of applying a heating step using electromagnetic waves such as laser heating or infrared heating, as shown in FIG. 1C, the sealing material layer 7 is irradiated with electromagnetic waves 10 such as a laser beam or infrared rays through the second glass substrate 2 (or the first glass substrate 1).

In a case of using a laser beam as electromagnetic waves 10, the laser beam is radiated as it is scanned along a frame-shaped sealing material layer 7. The laser beam is not particularly limited, and a laser beam emitted from various types of laser sources such as a semiconductor laser, a carbon dioxide laser, an excimer laser, a YAG laser or a HeNe laser, may be employed. In a case of using infrared rays as the electromagnetic waves 10, it is preferred to selectively irradiate the sealing material layer 7 with infrared rays by, for example, masking portions other than the sealing material layer 7—formed portion by an infrared-reflective film (e.g. Ag film).

Figure 1D:
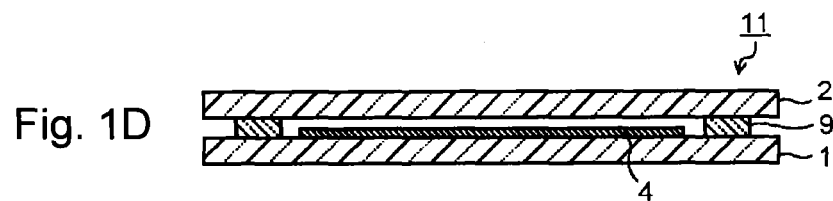

For example, in a case of using a laser beam as the electromagnetic waves 10, each portion of the sealing material layer 7 irradiated with the laser beam scanned along the sealing material layer 7 is rapidly heated and melted, and on completion of the irradiation of the laser beam, the portion is rapidly cooled, solidified and bonded to the first glass substrate 2. By irradiating the entire periphery of the sealing material layer 7 with the laser beam, as shown in FIG. 1D, a sealing layer 9 sealing a gap between the first glass substrate 1 and the second glass substrate 2 is formed. In a case of using infrared rays as the electromagnetic waves 10, the sealing material layer 7 is rapidly heated by the irradiation of infrared rays and melted, and on completion of the irradiation of the infrared rays, the layer is quickly cooled, solidified and bonded to the first glass substrate 1. By this step, a sealing layer 9 is formed as shown in FIG. 1D. A similar result is obtained also in cases of using other heating steps.

In the case of irradiating the sealing material layer 7 with electromagnetic waves 10 such as a laser beam or infrared rays to heat the layer, the sealing material layer 7 is melted and solidified by a rapid heating-rapid cooling process. At this time, when the amount of residual water in the sealing material layer 7 is large, bubbles tend to be formed in the sealing layer 9 by the rapid heating-rapid cooling process as described above. To cope with this problem, in this embodiment, a sealing material paste having a reduced amount of water is employed to reduce the amount of residual water in the sealing material layer 7. Accordingly, even if the sealing material layer 7 is melted and solidified by the rapid heating-rapid cooling process, it is possible to suppress generation of bubbles in the sealing layer 9. This method is effective also in a case of applying a heating step such as dielectric heating, induction heating or resistance heating whereby the temperature-rising speed becomes at least 100° C./min.

Thus, with a glass panel constituted by the first glass substrate 1, the second substrate 2 and the sealing layer 9, an electronic device 11 wherein an electronic element portion 4 disposed between the first glass substrate 1 and the second glass substrate 2 is hermetically sealed, is produced. Then, since it is possible to suppress generation of bubbles in the sealing layer 9 due to the rapid heating-rapid cooling process, it is possible to suppress with good reproducibility peeling or breakage of the sealing layer 9 due to the bubbles or resulting generation of defective sealing etc. Namely, it becomes possible to produce with good reproducibility an electronic device 11 excellent in sealing property and its reliability.

Here, the glass panel of this embodiment can be applied not only to the component of the electronic device 11 but also to a sealed electronic component or a glass member such as a multilayer glass (e.g. a member for buildings).

EXAMPLES

Now, specific examples of the present invention and their evaluation results will be described. Here, the present invention is not limited by the following descriptions, and the present invention can be modified within the gist of the present invention.

Example 1

A bismuth glass frit (glass transition point=358° C., softening point=412° C.) having a composition comprising, as calculated as the following oxides, 83 mass % of $Bi_2O_3$, 5 mass % of $B_2O_3$, 11 mass % of ZnO and 1 mass % of $Al_2O_3$ and having an average particle size of 1.2 μm produced by water pulverization; a cordierite powder having an average particle size of 2.0 μm as a low expansion filler; and a black pigment having a composition comprising $Fe_2O_3$—MnO—CuO—$Al_2O_3$ and an average particle size of 1.0 μm as a laser absorbent; were prepared.

82.7 mass % of the above bismuth glass frit, 11.6 mass % of the cordierite powder and 5.7 mass % of the black pigment were put in a plastic bag, they were manually blended to prepare a sealing material (powder material). Further, 5 mass % of ethylcellulose being an organic resin component (binder component) was dissolved in 95 mass % of an organic solvent composed of 2,2,4-trimethyl-1,3-pentanediol monoisobutyrate, to prepare a vehicle. Subsequently, 90 mass % of the sealing material and 10 mass % of the vehicle were blended by a planetary mixer under an environment wherein the absolute humidity was 7 g/m³ and they were subjected to precise dispersion by three rolls to prepare a sealing material paste. The sealing material paste was diluted by the organic solvent so that the viscosity became 100 Pa·s. The amount of water in the sealing material paste thus obtained was measured by a Karl Fischer moisture meter (heating condition: 300° C.), and as a result, the amount of water in the paste was 1.7 volume % (0.58 mass %).

Next, a second glass substrate (size (height×width×thickness): 90 mm×90 mm×0.7 mm) composed of alkali-free glass substrate (AN100 (thermal expansion coefficient: 38×10⁻⁷/° C.) manufactured by Asahi Glass Company, Limited) was prepared, the sealing material paste was applied on the sealing region of the glass substrate by a screen printing method, and it was dried at 120° C. for 10 minutes. Such a coating layer was fired under a condition of 460° C. for 10 minutes to form a sealing material layer having a thickness of 12 μm and a line width of 1 mm.

Next, a second glass substrate having the above sealing material layer was laminated with a first glass substrate (an alkali-free glass substrate having the same composition and the same shape as those of the second glass substrate) having an element region (a region wherein e.g. an OEL element is formed). Thereafter, the sealing material layer was irradiated with a laser beam (semiconductor laser) having a wavelength of 940 nm, an output power of 37 W and a spot diameter of 1.6 mm with a scanning speed of 10 mm/s through the second glass substrate by using a semiconductor laser heating apparatus (LD-HEATER L10060 manufactured by Hamamatsu Photonics K.K.) provided with a temperature-monitoring function, to rapidly heat and rapidly cool the sealing material layer to melt and solidify the layer to seal the first glass substrate and the second glass substrate together. Here, the temperature-rising speed of the sealing material layer irradiated with the laser beam was at least 100° C./sec according to the temperature monitor attached to the laser heating apparatus. Specifically, at the time of laser irradiation with scanning, a bismuth glass frit having a softening point of 412° C. was immediately (within 1 second) softened, and the reading of the temperature meter monitoring the temperature of the heating spot became about 800° C., and accordingly, the temperature-rising speed was judged to be at least 100° C./sec. An electronic device having a glass panel thus produced was subjected to characteristic evaluation to be described later.

Example 2

Formation of the sealing material layer and sealing of the first glass substrate and the second glass substrate together using a laser beam were carried out in the same manner as Example 1 except that powder materials (glass frit, a cordierite powder and black pigment) to be employed for preparation of the sealing material paste were preliminarily fired at 300° C. for 2 hours and that the prepared sealing material paste was put in a hermetically sealed container and maintained for 1 hour while it was stirred under a reduced pressure of −0.096 MPa. The amount of water in the sealing material paste after the reduced pressure treatment was 1.2 volume (0.42 mass %). An electronic device having a glass panel thus prepared was subjected to characteristic evaluation to be described later.

Comparative Example 1

Formation of the sealing material layer and sealing of the first glass substrate and the second glass substrate together by a laser beam were carried out in the same manner as Example 1 except that the sealing material paste was prepared in an environment wherein the absolute humidity was 11 g/m³. The amount of water in the sealing material paste was 2.2 volume % (0.78 mass %). An electronic device having a glass panel thus prepared was subjected to characteristic evaluation to be described later.

Comparative Example 2

Formation of the sealing material layer and sealing of the first glass substrate and the second glass substrate together by a laser beam were carried out in the same manner as Example 1 except that the sealing material paste was prepared in an environment wherein the absolute humidity was 15 g/m³. The amount of water in the sealing material paste was 2.8 volume % (0.96 mass %). An electronic device having a glass panel thus prepared was subjected to characteristic evaluation to be described later.

With respect to the glass panels prepared in the above Examples 1 and 2, peeling or breakage of the sealing layer and bonding state of the sealing layer, etc. were observed by an optical microscope and evaluated, and as a result, it was confirmed that they were all good. Airtightness of the glass panel was measured by a helium-leakage test, and as a result, it was confirmed that a good airtightness was obtained. Further, in order to evaluate generation of bubbles in the sealing layer in each Example, additional samples were prepared under the respective conditions of Examples 1 and 2 and Comparative Examples 1 and 2 except that the shape of the sealing material layer of each sample was changed to a three-line pattern of 30 mm long×1 mm wide and the sealing material layer was laser-heated. Generation state of bubbles in the three laser-heated lines was observed by a laser microscope, and the number of bubbles having a size of at least 100 μm was measured. Table 1 shows the results.

TABLE 1

|  | Ex. 1 | Ex. 2 | Comp. Ex. 1 | Comp. Ex. 2 |
| --- | --- | --- | --- | --- |
| Absolute humidity (g/m³) at a time of preparing paste | 7 | 7 | 11 | 15 |
| Preliminary firing of powder material | No | Yes | No | No |
| Stirring of paste under reduced pressure | No | Yes | No | No |
| Amount of water (volume %) in paste | 1.7 | 1.2 | 2.2 | 2.8 |
| Number of bubbles of at least 100 μm | 2 | 0 | 4 | 7 |

In the above Table 1, "paste" means "sealing material paste".

As evident from Table 1, it was understood that large amount of bubbles were generated in the sealing material layers of Comparative Examples 1 and 2, while generation of bubbles were suppressed in Examples 1 and 2 employing a sealing material paste wherein the amount of water is reduced. As a result, in Examples 1 and 2, generation of peeling or breakage of the sealing material layer were considered to be suppressed, and a good sealing state was obtained. Here, when a second glass substrate on which a sealing material layer was formed in the same manner as Comparative Example 1 was laminated with a first glass substrate 1 and the laminate was disposed in a firing furnace and subjected to a heat treatment at 480° C. for 3 hours (temperature-rising speed: 10° C./min) to form a sealing layer, the amount of generation of bubbles in the sealing layer was in the same level as that of Example 1. From these results, the basic cause of generation of bubbles is considered to be a rapid heating-rapid cooling process of e.g. laser heating.

INDUSTRIAL APPLICABILITY

The sealing material paste of the present invention can suppress with good reproducibility generation of bubbles in the sealing layer due to rapid heating, which can improve the sealing property of an electronic device and its reliability, and which is applicable to e.g. a flat display device.

REFERENCE SYMBOLS

1 . . . First glass substrate, 1a . . . surface, 2 . . . second glass substrate, 2a . . . surface, 3 . . . element region, 4 . . . electronic element portion, 5 . . . first sealing region, 6 . . . second sealing region, 7 . . . sealing material layer, 8 . . . coating layer of sealing material paste, 9 . . . sealing layer, 10 . . . electromagnetic waves, 11 . . . electronic device.

What is claimed is:

1. A sealing material paste, adapted for sealing a first glass substrate to a second glass substrate utilizing rapid heating with a temperature-raising speed of at least 100° C./min, and which sealing material paste comprises a mixture of a sealing material and a vehicle, wherein the sealing material comprises a sealing glass and a low expansion filler and the vehicle is produced by dissolving an organic resin in an organic solvent, wherein the amount of water in the sealing material paste is at least 0.1 and at most 2 volume %.

2. The sealing material paste according to claim 1, which is adapted for sealing utilizing laser heating, infrared heating, dielectric heating, induction heating or resistance heating.

3. The sealing material paste according to claim 1, wherein the sealing material contains from 0.1 to 20 mass % of a laser absorbent, and the sealing material is adapted for sealing by laser heating.

4. The sealing material paste according to claim 1, wherein the low expansion filler comprises at least one member selected from the group consisting of silica, alumina, zirconia, zirconium silicate, aluminum titanate, mullite, cordierite, eucryptite, spodumene, a zirconium phosphate compound, a tin oxide compound, a quartz solid solution and mica, and the sealing material contains from 0.1 to 40 mass % of the low expansion filler.

5. The sealing material paste according to claim 1, wherein the sealing glass comprises a bismuth glass comprising from 70 to 90 mass % of $Bi_2O_3$, from 1 to 20 mass % of ZnO and from 2 to 18 mass % of $B_2O_3$ as calculated as oxides.

6. The sealing material paste according to claim 3, wherein the sealing material contains from 0.1 to 15 mass % of the laser absorbent.

7. The sealing material paste according to claim 1, wherein
the sealing glass is a bismuth glass comprising from 70 to 90 mass % of $Bi_2O_3$, from 1 to 20 mass % of ZnO and from 2 to 18 mass % of $B_2O_3$ as calculated as oxides;
the low expansion filler is at least one member selected from the group consisting of silica, alumina, zirconia, zirconium silicate, aluminum titanate, mullite, cordierite, eucryptite, spodumene, a zirconium phosphate compound, a tin oxide compound, a quartz solid solution and mica;
a laser absorbent is present and comprises at least one metal selected from the group consisting of Fe, Cr, Mn, Co, Ni and Cu, or an oxide compound thereof;
the organic resin comprises methylcellulose, ethylcellulose, carboxymethylcellulose, oxyethylcellulose, benzylcellulose, propylcellulose, nitrocellulose, methyl (meth)acrylate, ethyl(meth)acrylate, butyl(meth) acrylate, or 2-hydroxyethyl methacrylate, and
the organic solvent comprises at least one selected from the group consisting of terpineol, diethylenegylcol monoethylether acetate, diethylenegylcol monobutylether acetate, propyleneglycol diacetate, 2,2,4-trimethyl-1,3-pentadiol monoisobutyrate, 2,2,4-trimethyl-1,3-pentanediol diisobutyrate, diethylenegylcol mono-2-ethylhexylether and 1,3-butyleneglycol diacetate.

8. The sealing material paste according to claim 7, wherein the low expansion filler is present in an amount of from 0.1 to 40 mass %;
the laser absorbent is present in an amount of from 0.1 to 15 mass %; and
the organic resin is present in an amount of from 0.1 to 5 mass %.

9. The sealing material paste according to claim 1, wherein the amount of water in the sealing material paste is at most 1.5 volume %.

10. A process for producing an electronic device, which comprises;
preparing a first glass substrate having a first surface having a first sealing region,
preparing a second glass substrate having a second surface having a second sealing region corresponding to the first sealing region of the first glass substrate;
applying the sealing material paste of claim 1 on the first sealing region and/or the second sealing region, and firing such a coating layer of the sealing material paste to form a sealing material layer;
laminating the first glass substrate and the second glass substrate via the sealing material layer so that the first surface faces to the second surface; and
heating the laminate of the first glass substrate and the second glass substrate with a temperature-rising speed of at least 100° C./min to melt the sealing material layer to seal an electronic element portion provided between the first glass substrate and the second glass substrate.

11. The process for producing an electronic device according to claim 1, wherein the sealing material layer is melted by laser heating, infrared heating, dielectric heating, induction heating or resistance heating.

12. The process for producing an electronic device according to claim 10, wherein the sealing material contains a laser absorbent and the sealing material layer is melted by irradiating the sealing material layer with a laser beam through the first glass substrate or the second glass substrate.

13. The process for producing an electronic device according to claim 10, wherein the low expansion filler comprises at least one member selected from the group consisting of silica, alumina, zirconia, zirconium silicate, aluminum titanate, mullite, cordierite, eucryptite, spodumene, a zirconium phosphate compound, a tin oxide compound, a quartz solid solution and mica, and the sealing material contains within a range of from 0.1 to 40 mass % of the low expansion filler.

14. The process for producing an electronic device according to claim 10, wherein the sealing glass comprises a bismuth glass containing within a range of from 70 to 90 mass % of $Bi_2O_3$, within a range of from 1 to 20 mass % of ZnO and within a range of from 2 to 18 mass % of $B_2O_3$ as calculated as oxides.

* * * * *